(12) United States Patent  (10) Patent No.: US 7,679,934 B2
Fan et al.  (45) Date of Patent: Mar. 16, 2010

(54) MOUNTING APPARATUS FOR CIRCUIT BOARD

(75) Inventors: Chen-Lu Fan, Shenzhen (CN); Chieh Yang, Shenzhen (CN); Li-Ping Chen, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 802 days.

(21) Appl. No.: 11/308,944

(22) Filed: May 29, 2006

(65) Prior Publication Data

US 2007/0144983 A1 Jun. 28, 2007

(30) Foreign Application Priority Data

Dec. 27, 2005 (CN) .......................... 2005 2 0121436

(51) Int. Cl.
 *H05K 7/14* (2006.01)
(52) U.S. Cl. ........................ 361/807; 361/796; 361/788; 361/730
(58) Field of Classification Search ................. 361/788, 361/796, 752, 807, 679.01, 679.02, 679.33, 361/679.34, 679.43
See application file for complete search history.

(56) References Cited

U.S. PATENT DOCUMENTS

| | | | | |
|---|---|---|---|---|
| 4,602,829 A | * | 7/1986 | De Andrea | 312/223.1 |
| 5,142,886 A | * | 9/1992 | Lonati | 66/222 |
| 5,735,411 A | * | 4/1998 | Flamme et al. | 211/26 |
| 6,088,222 A | * | 7/2000 | Schmitt et al. | 361/679.33 |
| 6,099,098 A | * | 8/2000 | Leong | 312/333 |
| 6,175,507 B1 | * | 1/2001 | Koradia et al. | 361/796 |
| 6,201,692 B1 | * | 3/2001 | Gamble et al. | 361/679.31 |
| 6,239,984 B1 | * | 5/2001 | Koradia et al. | 361/784 |
| 6,373,694 B1 | * | 4/2002 | Chang | 361/679.33 |
| 2004/0201972 A1 | * | 10/2004 | Walesa | 361/788 |

FOREIGN PATENT DOCUMENTS

TW 093202852 12/2004

* cited by examiner

*Primary Examiner*—Dameon E Levi
(74) *Attorney, Agent, or Firm*—Wei Te Chung

(57) ABSTRACT

A mounting apparatus includes a securing mechanism, a drive bracket (20), and a fastener (50). The securing mechanism has a securing hole (15) defined in a circuit board (10). The drive bracket includes first and second side plates (23, 24). The first side plate defines a mounting hole (237) therein, corresponding to the securing hole of the circuit board. The second side plate forms two lines of tabs (243) for sandwiching the circuit board therebetween. The fastener engages into the securing hole of the securing mechanism and the mounting hole of the drive bracket, for preventing the circuit board releasing from the tabs.

8 Claims, 4 Drawing Sheets

MOUNTING APPARATUS FOR CIRCUIT BOARD

FIELD OF THE INVENTION

The present invention relates to mounting apparatuses, and more particularly to a mounting apparatus for securing a circuit board.

DESCRIPTION OF RELATED ART

Generally, a plurality of large data storage devices is needed in a server system. It is well known that the server system isn't switched off when the data storage devices are serviced or replaced. The data storage devices are detached and installed from/to the server system while the server system remains on line. A circuit board is usually secured to a drive bracket that accommodates the data storage devices. The data storage devices can electrically connect with the circuit board when installed into the drive bracket.

In a mounting apparatus for securing the circuit board to the drive bracket, a locking plate is provided to hold the circuit board. The drive bracket includes a pair of side walls and a bottom wall. A plurality of posts is respectively disposed on the side walls and the bottom wall. The locking plate has two bent clips formed on opposite edges, and a bottom clip formed on a bottom edge. Two guiding slots and a through hole are defined in each bent clip, and two through holes are defined in the bottom clip. In assembly, the circuit board together with the locking plate is inserted in the drive bracket between the side walls. The posts of the side walls of the drive bracket are slid into the guiding slots of the bent clips of the locking plate, and the posts of the bottom wall are inserted into the through holes of the bottom clip. Numerous fasteners are respectively engaged with the posts of the bottom wall of the drive bracket, and engaged into the through holes of the bent clips, thereby fixing the circuit board and the locking clip into the drive bracket. However, the mounting apparatus has a complicated structure, and the manufacturing cost is high.

What is needed, therefore, is a mounting apparatus for securing a circuit board on a drive bracket with a simple structure.

SUMMARY OF INVENTION

A mounting apparatus includes a securing mechanism, a drive bracket, and a fastener. The securing mechanism has a securing hole defined in a circuit board. The drive bracket includes first and second side plates. The side plate defines a mounting hole therein, corresponding to the securing hole of the circuit board. The second side plate forms two lines of tabs for sandwiching the circuit board therebetween. The fastener engages into the securing hole of the securing mechanism and the mounting hole of the drive bracket, for preventing the circuit board releasing from the tabs.

Other advantages and novel features will be drawn from the following detailed description of preferred embodiments with attached drawings, in which:

DETAILED DESCRIPTION

Figure 1:
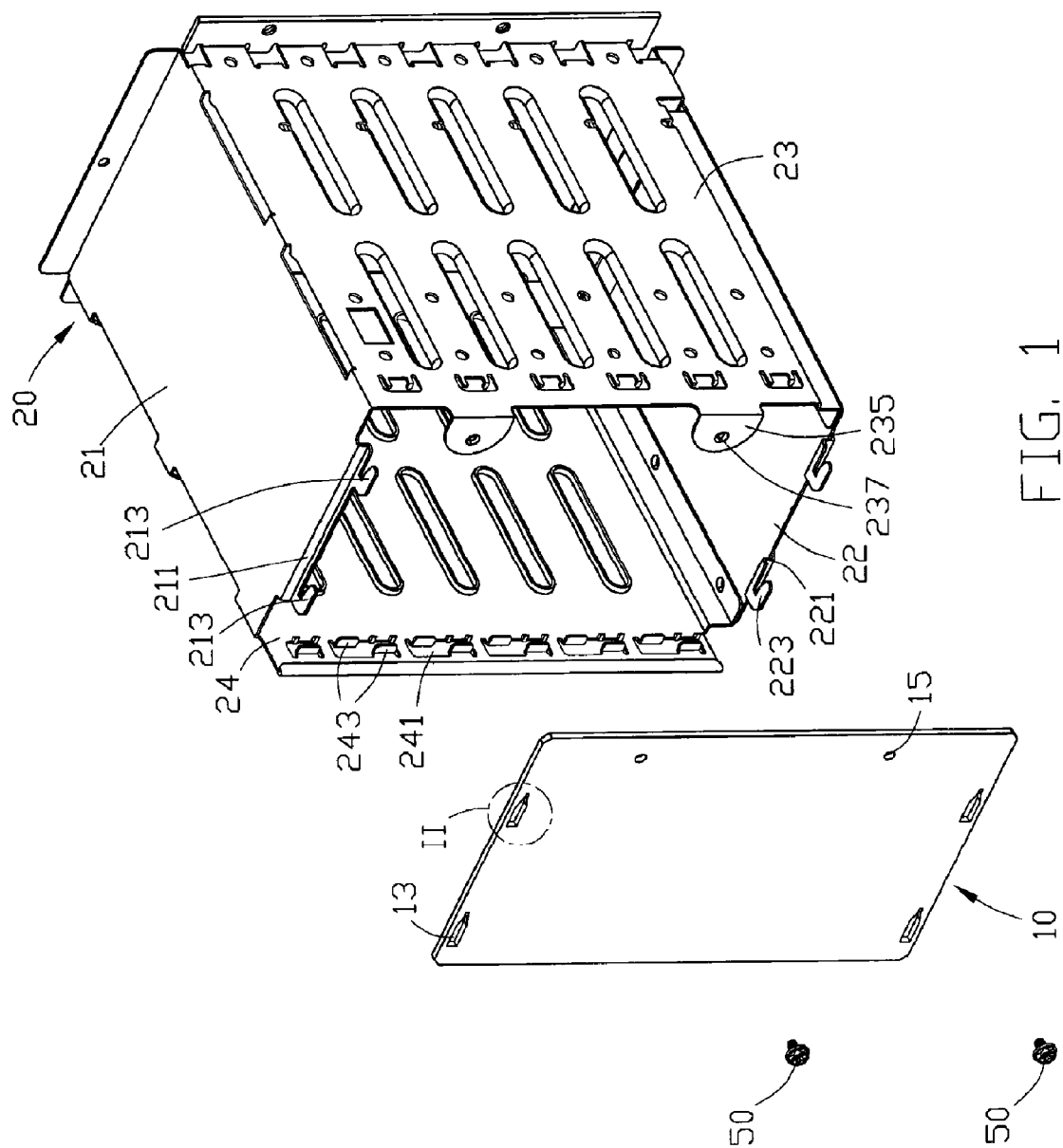
FIG. 1 is an exploded, isometric view of a mounting apparatus of a preferred embodiment of the present invention, together with a circuit board, the mounting apparatus including a drive bracket, a securing mechanism formed on the circuit board, and two fasteners.

Referring to FIG. 1, a mounting apparatus for securing a circuit part like a circuit board 10 includes a drive bracket 20 configured for accommodating component devices like data storage devices, a securing mechanism formed on the circuit board 10, and two fasteners 50, such as screws. The data storage devices can be hard disk drives of a computer system or a server system.

The bracket 20 includes a top plate 21, a bottom plate 22, a first side plate 23 and a second side plate 24. The top plate 21 is parallel to the bottom plate 22. The first and second side plates 23, 24 are perpendicular to both the top plate 21 and the bottom plate 22, and parallel to each other. Two locking clips 211, 221 extend respectively from rear edges of the top plate 21 and the bottom plate 22. A plurality of generally L-shaped hooks 213, 223 is respectively formed at both ends of the locking clips 211, 221, and extends along a same direction towards the first side plate 23. The first side plate 23 has two mounting clips 235 perpendicularly bent in from a rear edge thereof. Each mounting clip 235 defines a mounting hole 237 therein. The second side plate 24 has a greater width than that of the first side plate 23, and defines a plurality of through openings 241 therein adjacent a rear edge thereof. A plurality of tabs 243 is respectively bent in from opposite edges of the through openings 241, and is generally parallel to the rear edge of the second side plate 24.

Figure 2:
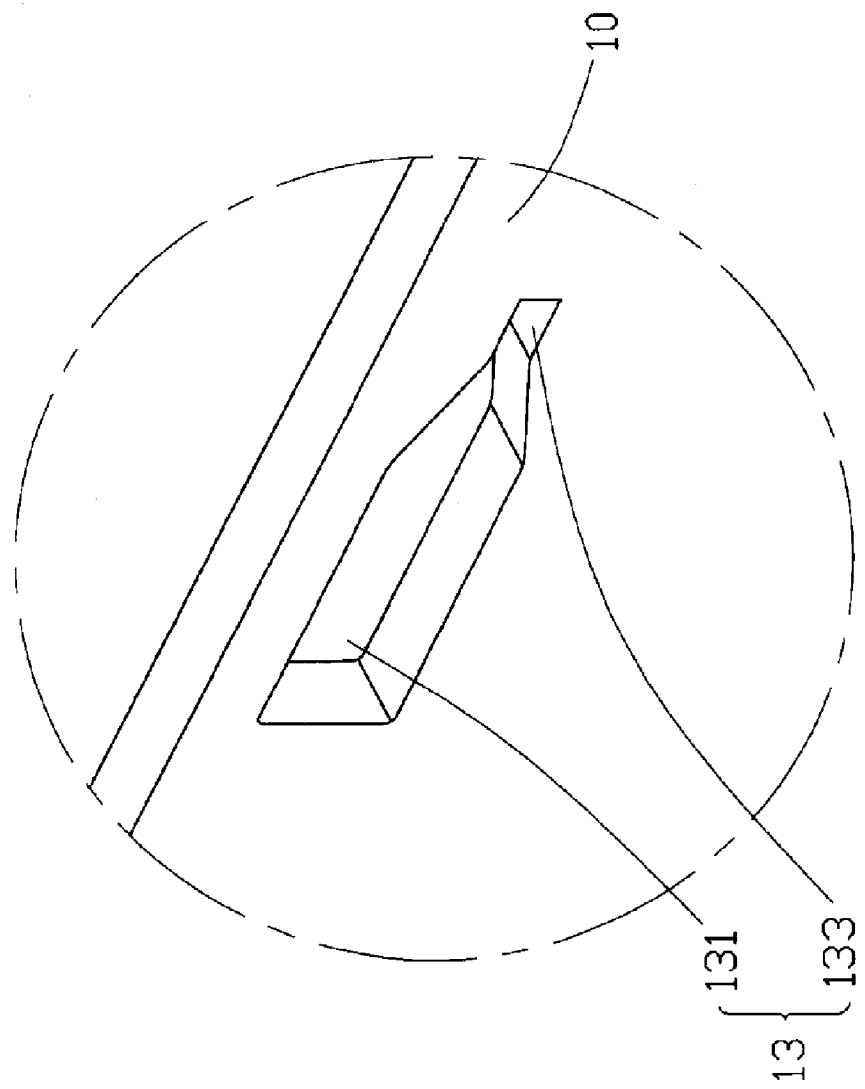
FIG. 2 is an enlarged view of circled portion II of FIG. 1.

Referring to FIGS. 1 and 2, the securing mechanism formed on the circuit board 10 has a plurality of locking openings 13 defined adjacent a top edge and a bottom edge of the circuit board, corresponding to the hooks 213, 223 of the drive bracket 20, and two securing holes 15 defined adjacent a side edge of the circuit board 10 corresponding to the mounting holes 237 of the mounting clips 235. Each locking opening 13 includes a wide portion 131 and a narrow portion 133. Each wide portion 131 has a greater width than that of each narrow portion 133. The width of each narrow portion 133 is generally equal to a thickness of each hook 213, 223 of the drive bracket 20. A distance between the two tabs 243 of each through opening 241 is generally equal to a thickness of the circuit board 10.

Figure 3:
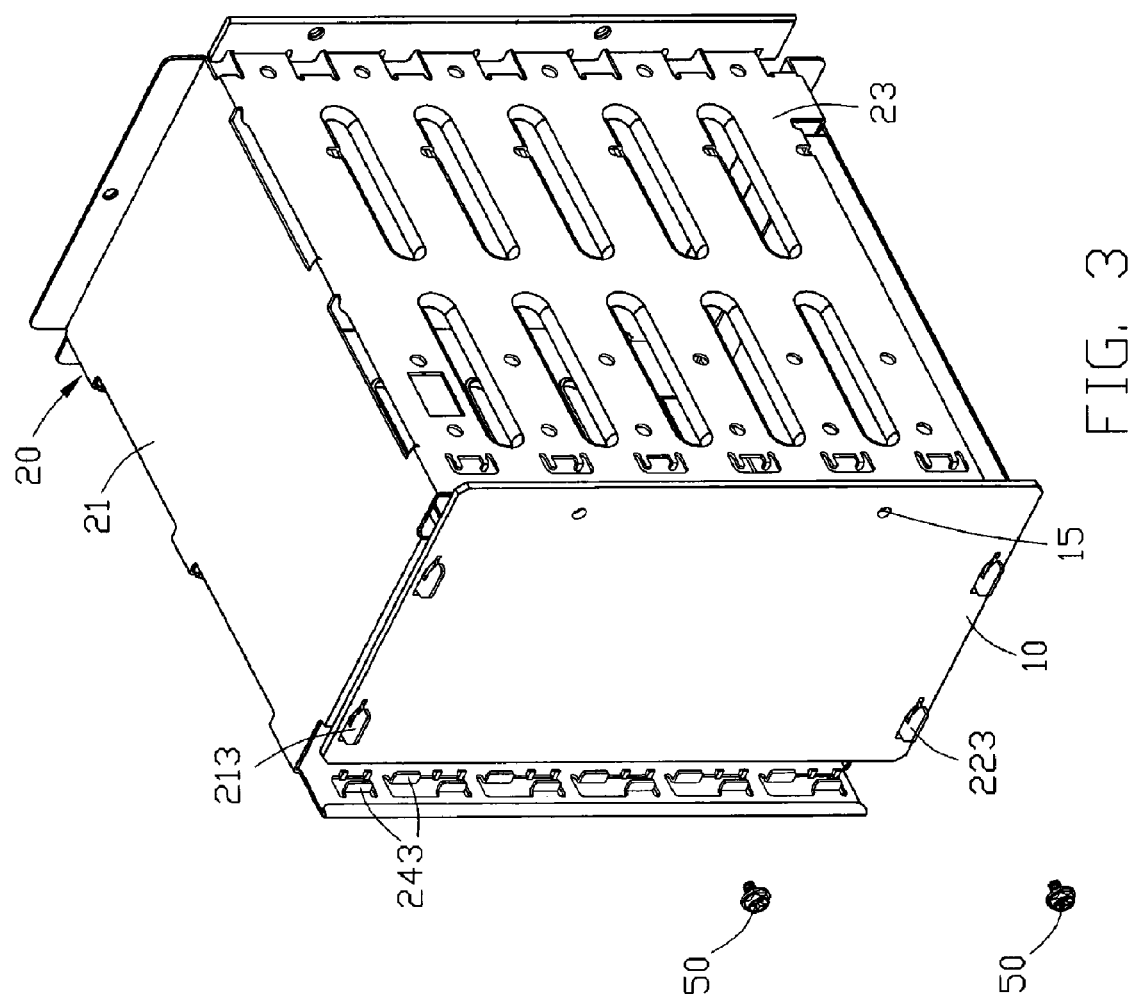
FIG. 3 is a pre-assembled view of the mounting apparatus of FIG. 1, showing the circuit board in an unlocked position.
Figure 4:
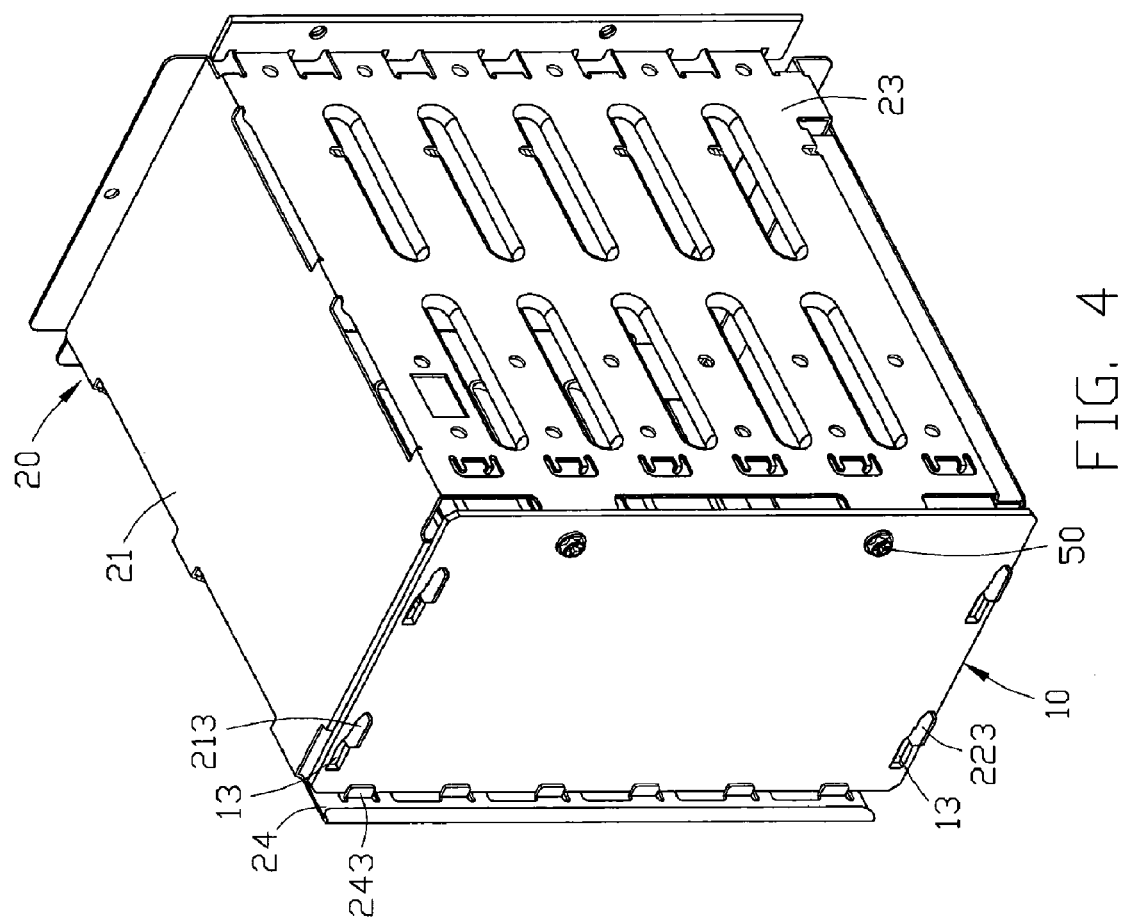
FIG. 4 is an assembled view of FIG. 1, showing the circuit board in a locked position.

Referring also to FIGS. 3 and 4, in assembly, the hooks 213, 223 of the drive bracket 20 are inserted into the locking openings 13 of the circuit board 10 through the wide portions 131. The circuit board 10 is pushed towards the second side plate 24 along the rear edges of the top plate 21, the bottom plate 22 and the first side plate 23, until the circuit board 10 is inserted and sandwiched between the tabs 243 of the through openings 241 of the second side plate 24. The hooks 213, 223 are slid into the narrow portions 133 of the locking openings 13, and abut against an outer surface of the circuit board 10, thereby preventing the circuit board 10 moving along a first direction perpendicular to the circuit board 10. At the same time, the securing holes 15 of the circuit board 10 align with the mounting holes 237 of the mounting clips 235 of the drive bracket 20. Two fasteners 50 are screwed into the securing holes 15 and the mounting holes 237, thereby fixing the circuit board 10 on the drive bracket 20, and preventing the circuit board 10 moving along a second direction perpendicular to the first direction. The circuit board 10 is thus secured to the drive bracket 20. When the data storage devices are installed into the drive bracket 20, the data storage devices are electrically connected with the circuit board 10.

In removal of the circuit board 10, the fasteners 50 are taken away from the securing holes 15 and the mounting holes 237 to release the circuit board 10. The circuit board 10 can be accordingly slid along the second direction until the hooks 213, 223 are positioned in the wide portions 131 of the locking openings 13 of the circuit board 10. The circuit board 10 is disengaged from between the tabs 243 of the drive bracket 20, and can be thus removed from the drive bracket 20.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus comprising:
   a securing mechanism having a securing hole defined in a circuit board;
   a drive bracket comprising first and second side plates, the first side plate defining a mounting hole therein corresponding to the securing hole of the circuit board, the second side plate forming two lines of tabs, one side of the circuit board being located between the two lines of tabs to limit a movement of the circuit board parallel to the second side plate; and
   a fastener engaging into the securing hole of the securing mechanism and the mounting hole of the drive bracket, for preventing the circuit board releasing from the tabs.

2. The mounting apparatus as described in claim 1, wherein a mounting clip is perpendicularly bent from the first side plate, and defines the mounting hole therein.

3. The mounting apparatus as described in claim 1, wherein the drive bracket further comprises a top plate and a bottom plate both perpendicular to the first and second side plates, and a plurality of hooks is formed on both the top plate and the bottom plate, the securing mechanism further has a plurality of locking openings defined in the circuit board for receiving the hooks.

4. The mounting apparatus as described in claim 3, wherein the hooks are generally L-shaped, and extend along a same direction towards the first side plate.

5. The mounting apparatus as described in claim 3, wherein each of the locking openings comprises a wide portion and a narrow portion, the wide portion has a width greater than that of the narrow portion, and the width of the narrow portion is generally equal to a thickness of each of the hooks.

6. The mounting apparatus as described in claim 1, wherein a plurality of through openings is defined in the second side plate and disposed along a direction perpendicular to the top plate, and the tabs are formed on opposite edges of the through openings.

7. The mounting apparatus as described in claim 6, wherein a distance between the tabs of each through opening is generally equal to a thickness of the circuit board.

8. The mounting apparatus as described in claim 1, wherein the two lines of tabs are staggered relative to each other.

* * * * *